(12) United States Patent
Grosjean et al.

(10) Patent No.: US 12,351,452 B1
(45) Date of Patent: Jul. 8, 2025

(54) MEMS WITH SMALL-MOLECULE BARRICADE

(71) Applicant: SiTime Corporation, Santa Clara, CA (US)

(72) Inventors: Charles I. Grosjean, Los Gatos, CA (US); Paul M. Hagelin, Saratoga, CA (US); Michael Julian Daneman, Campbell, CA (US); Ginel C. Hill, Sunnyvale, CA (US); Aaron Partridge, Cupertino, CA (US)

(73) Assignee: SiTime Corporation, Sunnyvale, CA (US)

( * ) Notice: Subject to any disclaimer, the term of this patent is extended or adjusted under 35 U.S.C. 154(b) by 43 days.

(21) Appl. No.: 18/347,139

(22) Filed: Jul. 5, 2023

Related U.S. Application Data (60) Continuation of application No. 17/016,099, filed on Sep. 9, 2020, now Pat. No. 11,718,518, which is a division of application No. 15/887,145, filed on Feb. 2, 2018, now Pat. No. 10,800,650.

(60) Provisional application No. 62/453,993, filed on Feb. 2, 2017.

(51) Int. Cl.
*B81B 7/00* (2006.01)
*B81C 1/00* (2006.01)

(52) U.S. Cl.
CPC ........ *B81B 7/0038* (2013.01); *B81C 1/00285* (2013.01)

(58) Field of Classification Search
None
See application file for complete search history.

(56) References Cited

U.S. PATENT DOCUMENTS

| | | | |
|---|---|---|---|
| 6,388,300 B1 | 5/2002 | Kano | |
| 7,923,790 B1 * | 4/2011 | Quevy | B81C 1/00293 |
| | | | 257/415 |
| 8,580,596 B2 | 11/2013 | Magnee | |
| 9,487,391 B2 | 11/2016 | Cheng | |
| 10,427,932 B2 | 10/2019 | Ehmke | |
| 10,696,547 B2 | 6/2020 | Daneman | |
| 10,800,065 B2 | 10/2020 | Grosjean | |
| 11,011,548 B2 | 5/2021 | Izumitani | |
| 2008/0079142 A1 | 4/2008 | Carmona et al. | |
| 2009/0050988 A1 | 2/2009 | Suzuki et al. | |
| 2010/0240163 A1 | 9/2010 | Candler | |
| 2012/0060607 A1 * | 3/2012 | Yoshida | G01L 9/0019 |
| | | | 73/579 |
| 2012/0256308 A1 | 10/2012 | Helin | |
| 2015/0097215 A1 | 4/2015 | Chu | |
| 2015/0123217 A1 | 5/2015 | Reinmuth et al. | |
| 2016/0023888 A1 | 1/2016 | Quevy et al. | |
| 2016/0043299 A1 | 2/2016 | Fujimora | |
| 2017/0113917 A1 | 4/2017 | Yoshikawa | |
| 2018/0143318 A1 | 5/2018 | Flynn | |
| 2019/0027414 A1 | 1/2019 | Ramadas | |

FOREIGN PATENT DOCUMENTS

| | | |
|---|---|---|
| EP | 1460038 A2 | 9/2004 |
| JP | H07130845 A1 | 5/1995 |

* cited by examiner

*Primary Examiner* — Benjamin P Sandvik (57) ABSTRACT

A MEMS element within a semiconductor device is enclosed within a cavity bounded at least in part by hydrogen-permeable material. A hydrogen barrier is formed within the semiconductor device to block propagation of hydrogen into the cavity via the hydrogen-permeable material.

20 Claims, 8 Drawing Sheets

FIG. 2
Barrier-Last with Gettering Layer

FIG. 3  MEMS Chip

FIG. 4
Barrier-First

FIG. 5 Embedded-Barrier

FIG. 6  Embedded-Barrier Alternative

FIG. 7 Extended Metal

FIG. 9 Embedded-Barrier Process Flow

MEMS WITH SMALL-MOLECULE BARRICADE

CROSS-REFERENCE TO RELATED APPLICATIONS

This application is a continuation of U.S. Utility patent application Ser. No. 17/016,099 filed Sep. 9, 2020 ("MEMS with Small-Molecular Barricade"), which is a division of U.S. Utility patent application Ser. No. 15/887,145 filed Feb. 2, 2018 ("MEMS with Small-Molecular Barricade"), now issued as U.S. Pat. No. 10,800,650, which in turn claims priority to U.S. Provisional Patent Application No. 62/453,993 filed Feb. 2, 2017 ("MEMS Cavity with Gas-Resistant Seal"). Each of the foregoing application is hereby incorporated by reference.

TECHNICAL FIELD

The disclosure herein relates to microelectromechanical systems (MEMS).

INTRODUCTION

MEMS structures are typically sealed in a low-pressure or controlled-pressure enclosure to ensure consistent operation over time and temperature. Because conventional sealant materials (e.g., silicon dioxide and silicon) are permeable to small gas molecules such as hydrogen and helium, however, such molecules can propagate through the sealant materials into the enclosure, changing the internal pressure and thereby degrading MEMS device operation or stability. Materials such as single-crystal silicon or polycrystalline silicon, though generally more resistant to hydrogen/helium intrusion, can still become significantly permeable at sufficiently elevated temperatures, leading to operational degradation or failure in MEMS devices subject to hydrogen/helium environments.

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments disclosed herein, MEMS structures are barricaded (sealed, encased or otherwise enclosed) within a cavity or chamber by an enclosure resistant to hydrogen, helium, or other small molecule permeation. In a number of implementations, otherwise hydrogen-permeable portions of the cavity enclosure are covered (or sealed) with a hydrogen/helium-resistant structure (i.e., layer of material and/or strategically disposed blocking element substantially impermeable to hydrogen and/or helium molecules) that significantly reduces small-molecule permeation into the enclosure and thus avoids gradual pressure change and other degradative effects that plague conventional MEMS devices. Hydrogen/helium-resistant materials used to form such coating, layer or blocking element include, for example and without limitation, dispositions of one or more metals (including alloys) such as aluminum, copper, titanium, titanium nitride, and metal silicides, and/or as dielectrics such as silicon nitride, aluminum nitride, and aluminum oxide, silicon carbide, etc. In some cases, semiconductor materials (silicon, germanium, etc.) are used to form constituent structures of the small-molecule barricade.

As part of device fabrication and prior to disposition of a complete hydrogen/helium barrier (i.e., membrane, layer, plug or other material disposition that will prevent or significantly limit small-molecule permeation into the MEMS cavity), residual hydrogen and/or helium within the MEMS cavity or cavity enclosure materials may be outgassed, removed or otherwise evacuated. This "small-molecule evacuation" operation avoids trapping hydrogen/helium inside the cavity or the cavity-enclosure materials (i.e., on the wrong side/interior side of the hydrogen-impermeable barrier), the latter of which may otherwise outgas into the cavity over time, resulting in the aforementioned degradative pressure change. In a number of fabrication processes, residual hydrogen/helium (or other small molecules) is outgassed or otherwise evacuated by raising the MEMS device to an elevated temperature prior to barrier material deposition—for example, heating to any practicable temperature between 100° Celsius (C) and 1150° C. (and in some embodiments between 300° C. and 600° C.) though elevation to temperatures outside that range may be effected.

The deposition processes for some barrier materials (e.g., silicon nitride, silicon oxynitride) produce hydrogen and can therefore undesirably introduce/embed hydrogen into the MEMS cavity or cavity enclosure materials. In a number of embodiments, this consequence is avoided or mitigated by (i) depositing or otherwise forming a first barrier layer of hydrogen-resistant material (typically but not necessarily a dielectric), (ii) forming openings in the barrier material so as to selectively expose hydrogen permeable materials within the MEMS device stack and/or portions of the cavity enclosure, (iii) outgassing the device at an elevated temperature (e.g., a temperature within either of the elevated ranges mentioned above) to remove residual hydrogen produced by the first barrier layer deposition and/or earlier process steps, and then (iv) depositing a second barrier layer of hydrogen resistant material that can be deposited in a relatively hydrogen-free process (typically a metal deposited by sputtering or evaporation). A gettering material may be included in the second barrier layer stack (or may completely comprise the second barrier layer) to adsorb or chemically react with residual hydrogen or other unwanted species. Also, in a number of embodiments, grooves, channels, slots or other structures are formed in the first barrier layer to increase the surface area of the getter material and thereby improve adsorption and/or any desired chemical reaction. For MEMS cavities where a portion of the side enclosure is formed from silicon dioxide, as would be the case when using SOI (silicon-on-insulator) wafers, a trench filled with monocrystalline or polycrystalline silicon, metal, or other hydrogen/helium resistant material may be formed through the oxide to the substrate below, blocking the oxide diffusion path.

Figure 1:
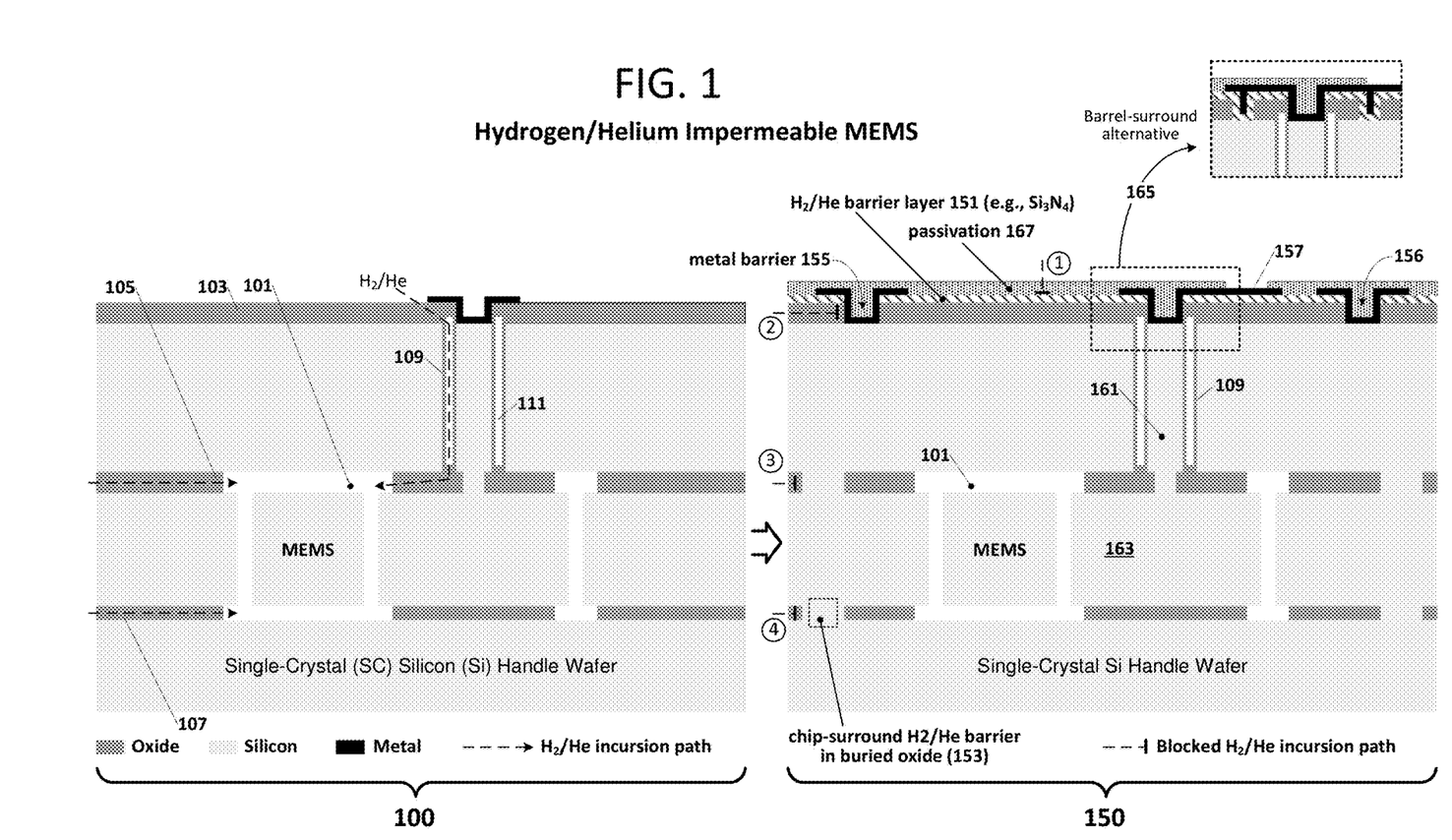
FIG. 1 contrasts a MEMS embodiment having hydrogen (i.e., small-molecule) barrier structures with a counterpart implementation that lacks hydrogen-barrier structures.

FIG. 1 contrasts a MEMS embodiment having hydrogen (i.e., small-molecule) barrier structures-referred to herein as a barricaded MEMS—with a counterpart implementation that lacks those barrier structures. Referring first to non-barricaded implementation 100, small-molecule permeates (i.e., hydrogen and helium either of which should be understood to be representative of small-molecule permeates generally) may diffuse or otherwise propagate through various oxide paths and/or voids into otherwise hermetically sealed chamber 101 (i.e., cavity in which MEMS element is disposed). More specifically, hydrogen/helium incursion paths exist within surface oxide 103 as well as middle oxide 105 and buried (bottom) oxide 107 (such oxide layers implemented, for example, by silicon dioxide ($SiO_2$), silicon oxynitride ($Si_2N_2O$) and/or other hydrogen-permeable dielectric). Incursion through contact-isolation trench 109 is particularly problematic as small-molecules need only diffuse through a relatively thin surface oxide, pass freely through keyholes (voids) 111, and then diffuse directly into chamber 101 through relatively short segments of middle oxide 105. Accordingly, when subjected to an environment containing hydrogen or helium (i.e., small molecules), those molecules/atoms propagate into the MEMS cavity, undesirably changing the chamber pressure and thus degrading MEMS operation/stability (e.g., changing resonance frequency of MEMS resonator) over time.

In barricaded MEMS embodiment 150, a hydrogen-barrier layer 151 (i.e., "small-molecule barrier) is formed over the surface oxide to block surface-level hydrogen incursion (shown at 1), while other barrier structures are formed in the buried, middle and surface oxide layers to block lateral hydrogen incursion channels (2, 3 and 4). In the depicted implementation, for example, a monocrystalline or polycrystalline silicon chip-surround barrier 153 is formed in the middle and bottom oxide layers, while a metal barrier 155 serves dual duty in the surface oxide layer—blocking lateral diffusion through the surface oxide and also closing an optional hydrogen-release vent (opening) within hydrogen barrier layer 151. In a number of embodiments, metal barrier 155 forms a surface-level perimeter barrier that surrounds a field of electrical contacts and interconnect pads-α continuous metal ring that includes both barrier-metal cross sections 155 and 156.

In one embodiment, surface-level hydrogen barrier 151 is formed by silicon nitride ($Si_3N_4$) or other hydrogen-impermeable (hydrogen-resistant/hydrogen-blocking) dielectric, permitting deposition/formation of metal barrier 155 and metal contact 157 directly over the barrier layer. In other embodiments, the surface-level hydrogen barrier may be implemented by any of various metals or metal alloys or other electrically conductive materials (including doped semiconductor materials). In those cases, a layer of dielectric material may be disposed over the hydrogen barrier layer to enable contact isolation. In all embodiments, the term blocking should be understood to mean substantially impermeable to the subject small-molecule/atom—that the blocking or barrier material limits hydrogen and/or helium diffusion therethrough to a negligible rate (e.g., rate that does not appreciably impact cavity pressure and/or device stability over the intended device lifetime). Also, with respect to contact formation and relation to the MEMS element within cavity 101, metal contact 157 enables electrical conduction through an oxide-isolated via 161 (e.g., formed by a doped silicon barrel 161 within oxide-isolation trench 109) to device layer electrode 163 while other contacts not shown may be provided to establish surface level electrical contact to other electrode(s) and/or to the MEMS element itself (e.g., through conductive path(s) formed in MEMS-element anchoring/tethering structures). Accordingly, metal contact 157, oxide-isolated via/conduction barrel 161 and device-layer electrode 163 are intended as a non-limiting example of electrical contact/interconnect formation and manner of hydrogen barrier implementation with respect to that contact. More generally, such contact may be used to apply bias voltage to the MEMS element within cavity 101 ("MEMS"), to deliver a resonator actuation ("drive") signal (e.g., to a piezoelectric component of the MEMS element in the case of a piezo-actuated resonator, or to a drive electrode disposed in proximity to the MEMS element in an electrostatically actuated resonator), to conduct an electrostatically or piezoelectrically generated resonant-motion "sense" signal (periodic electrical signal representative of mechanical motion of resonator), to conduct a thermistor current, and so forth.

Still referring to FIG. 1 and more specifically to detail view 165, barrier layer 151 may be disposed in a barrel-surround geometry to form a hydrogen-impermeable ring around the oxide region in proximity to conduction barrel 161 so that, even without chip-surround metal barrier 155/156, the hydrogen diffusion path through the surface oxide is blocked. Also, an optional passivation layer 167 may be provided to cover the hydrogen barrier layer and metal barrier 155/156, while exposing a region of metal contact 157.

Figure 2:
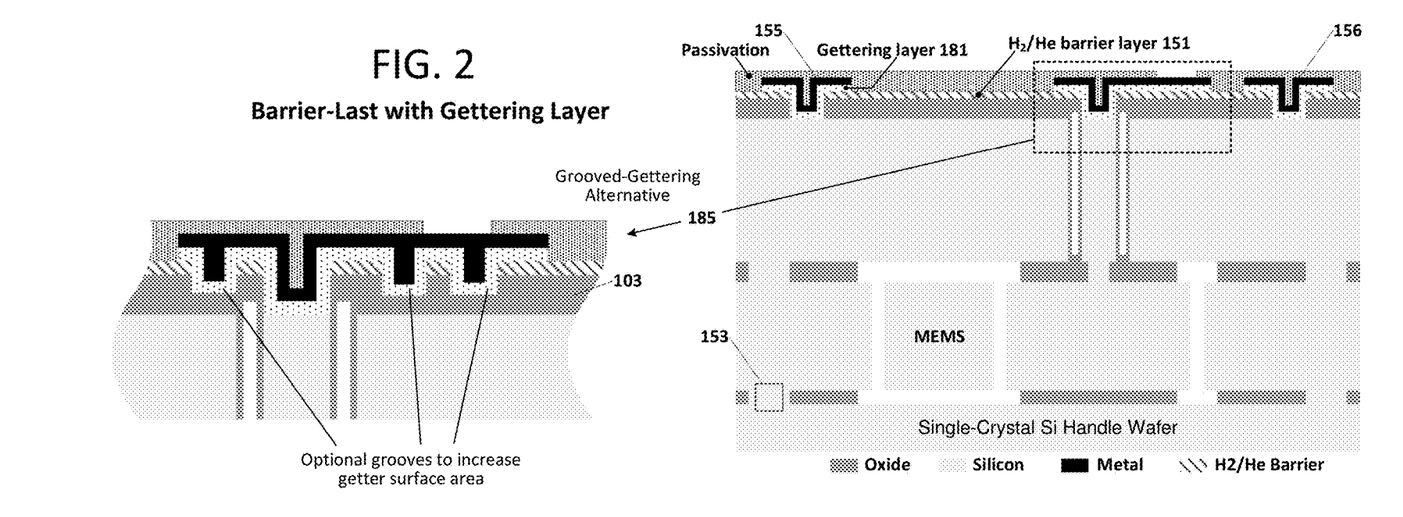
FIG. 2 illustrates a barricaded MEMS embodiment having a hydrogen-impermeable gettering layer disposed in the metal layer stack to absorb residual hydrogen following barrier layer deposition and small-molecule bake-out, the latter being an optional process step discussed below.

FIG. 2 illustrates a barricaded MEMS embodiment having a hydrogen-impermeable gettering layer 181 disposed in the metal-layer stack to adsorb residual hydrogen following barrier layer deposition and small-molecule bake-out, the latter being an optional process step discussed below. Various materials may be used to implement the gettering layer (e.g., titanium, zirconium alloy or any other conductive material useful for adsorbing or chemically reacting with small-molecule permeates) and such layer may be included within the metal stack of any embodiments presented herein, depicted or not. Also, as shown in detail view 185, optional trenches may be etched (or otherwise formed) through the barrier layer and into surface oxide 103 to effect formation of gettering-layer grooves or depressions and thus increased gettering surface area for improved small-molecule adsorption. Though depicted as extending only partially into the surface oxide layer, such trenches or any one or more thereof may extend entirely through the oxide layer to enable formation of a barrel-surround structure as shown at 165 in FIG. 1—an approach that may enable omission of other hydrogen blocking structures within the surface oxide.

Figure 3:
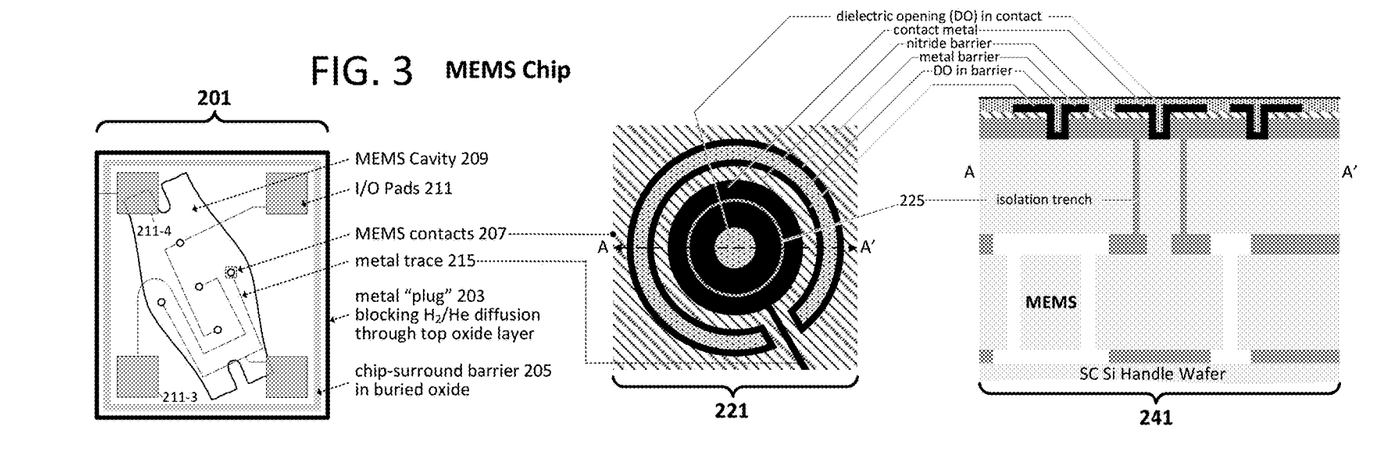
FIG. 3 illustrates a barricaded MEMS embodiment having a hydrogen-impermeable gettering layer disposed in the metal layer stack to absorb residual hydrogen following barrier layer deposition and small-molecule bake-out.

FIG. 3 presents a top-view (201) of a barricaded MEMS embodiment, including expanded top and cross-sectional views (221 and 241) of an exemplary MEMS contact structure. Referring first to top-view 201, the barricaded MEMS chip includes a perimeter metal blocking plug 203 to block lateral hydrogen diffusion through the surface oxide (i.e., a structure corresponding to metal barriers 155/156 in FIGS. 1 and 2), as well as a chip-surround barrier 205 in the buried oxide layer (e.g., to form chip-surround barriers 153 shown in FIGS. 1 and 2). Within the perimeter metal barrier, multiple MEMS contacts 207 (five in this example) are provided to conduct operational signals and voltages (e.g., drive, sense, bias, measurement, etc.) with respect to a resonator or other micromachined element within MEMS cavity 209. As shown, each contact is coupled to an I/O pad 211 via a conductive trace 215 (e.g., metal trace), with a single I/O pad being coupled to multiple contacts in some cases. Also, while upper left I/O pad 211 is shown electrically coupled to perimeter metal 203, that I/O pad may also be coupled to contacts or other conductive structures within the MEMS chip. Further, though depicted with four external contacts (e.g., to convey ground voltage, bias voltage, sense signal and drive signal in resonator embodiment) and five MEMS contacts 207, the subject MEMS chip may be implemented with more or fewer external contacts and/or MEMS contacts in alternative embodiments.

Referring to detail top view 221 (a view beneath any passivation layer) and corresponding cross-sectional view 241, exemplary MEMS contact 207 includes a center metal contact ("contact metal") and an outer metal barrier-surround ("metal barrier")—two electrically isolated metal features in the depicted embodiment, though those features may be unified as shown at 165 in FIG. 1. The oxide-isolation trench (i.e., trench surrounding through-silicon conduction barrel) is depicted in shaded outline at 225, though that feature is generally not visible from the surface view. The outer metal barrier serves to block the isolation trench from the surface dielectric layer that may contain embedded hydrogen. The break in the metal barrier ring permits trace routing to the center metal contact and may have a minimal width (i.e., opening to permit trace routing) to yield the narrowest possible (or acceptably narrow) path between the dielectric layers inside and outside the outer-metal barrier ring (which may have a square, rectangular or polygonal outline instead of the circular outline shown).

Figure 4:
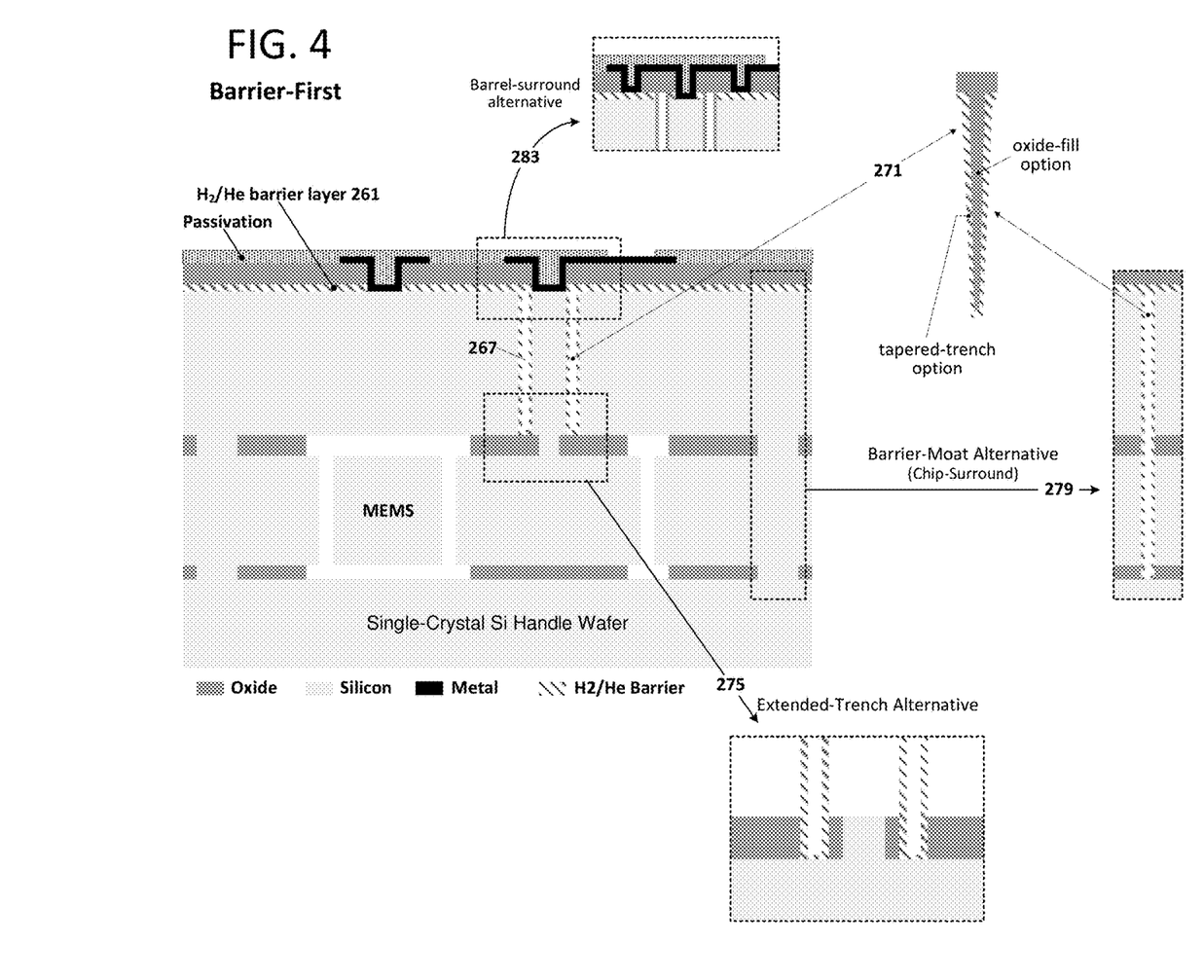
FIG. 4 illustrates an alternative barricaded MEMS embodiment in which the hydrogen barrier layer is deposited or otherwise formed on the silicon capping layer prior to surface oxide deposition.

FIG. 4 illustrates an alternative barricaded MEMS embodiment in which a hydrogen barrier layer 261 is deposited or otherwise formed on the lid-layer silicon prior to deposition of surface oxide 263—an embodiment referred to herein as "barrier-first" in contradistinction to the "barrier-last" embodiments of FIGS. 1-3 in which the surface-level hydrogen barrier is deposited/formed after deposition of the surface oxide. In the FIG. 4 embodiment, the hydrogen barrier descends into contact isolation trench 267, coating or lining the walls thereof optionally to be filled with oxide or other dielectric or to fill the trench completely. The contact-isolation trench may be tapered as shown at 271 to facilitate barrier material deposition/formation. Also, instead of stopping at the middle oxide, the isolation trenches may extend through the middle oxide layer to the device-layer silicon as shown at 275. Further, barrier-filled or barrier-lined trenches may be used to form the perimeter chip-surround structure as shown at 279, extending through both the middle and buried oxide layers. More generally, such barrier-lined (or barrier-filled) chip-surround structure may be implemented in any of the embodiments presented herein (e.g., in the barrier-last embodiments of FIGS. 1-3) instead of or in addition to the single-crystal silicon or polysilicon barrier discussed above (e.g., elements 153 in FIGS. 1 and 2). Also, as in the FIG. 1-2 embodiments, the metal contact may form a surface-level barrier around contact-isolation trench 267 (e.g., as shown at 283), a particularly effective solution where trench 267 is lined/filled with oxide instead of hydrogen-barrier material.

Figure 5:
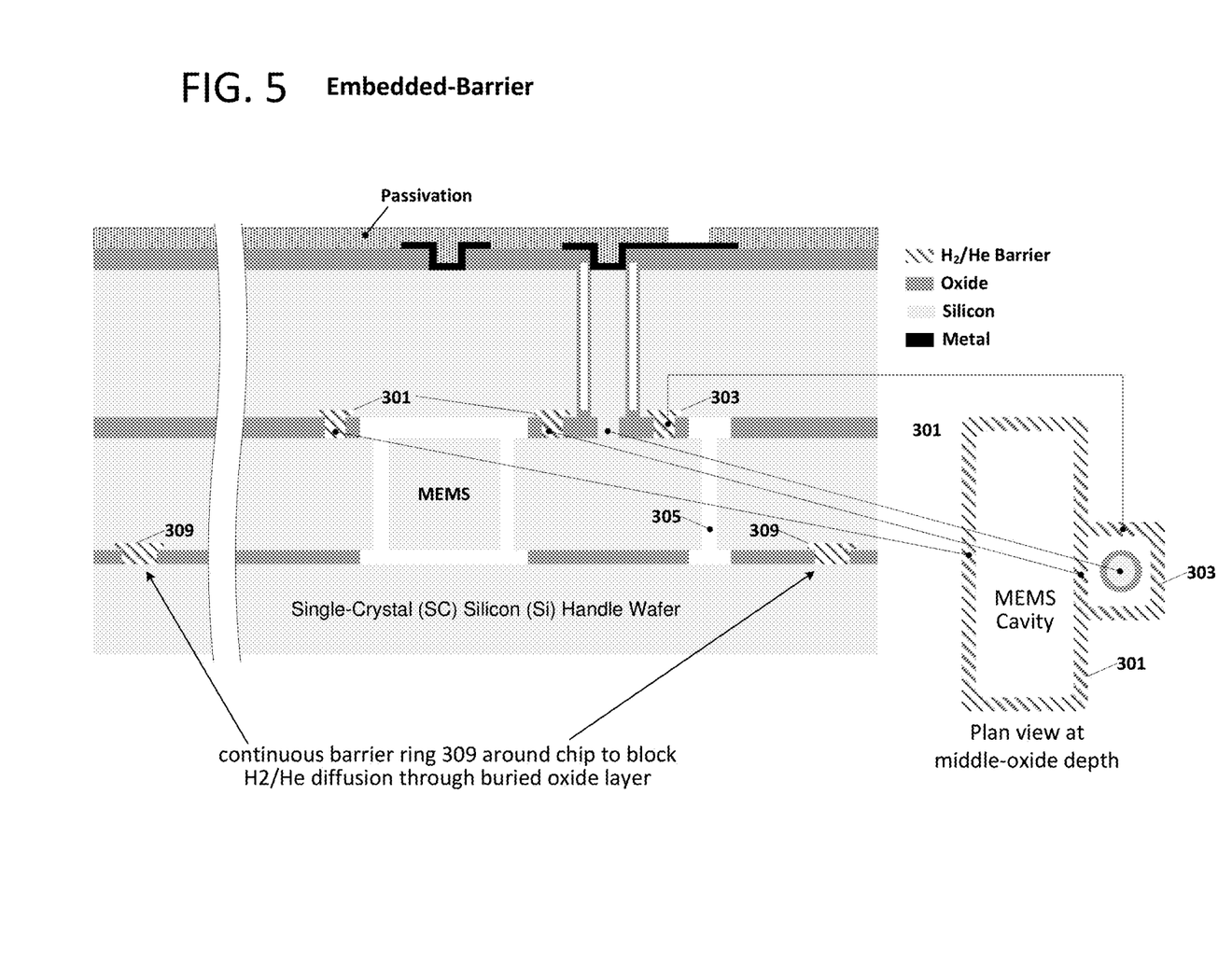
FIG. 5 illustrates a barricaded MEMS embodiment having hydrogen barrier structures strategically disposed in the middle and buried oxide layers, obviating surface-level barrier deposition.
Figure 6:
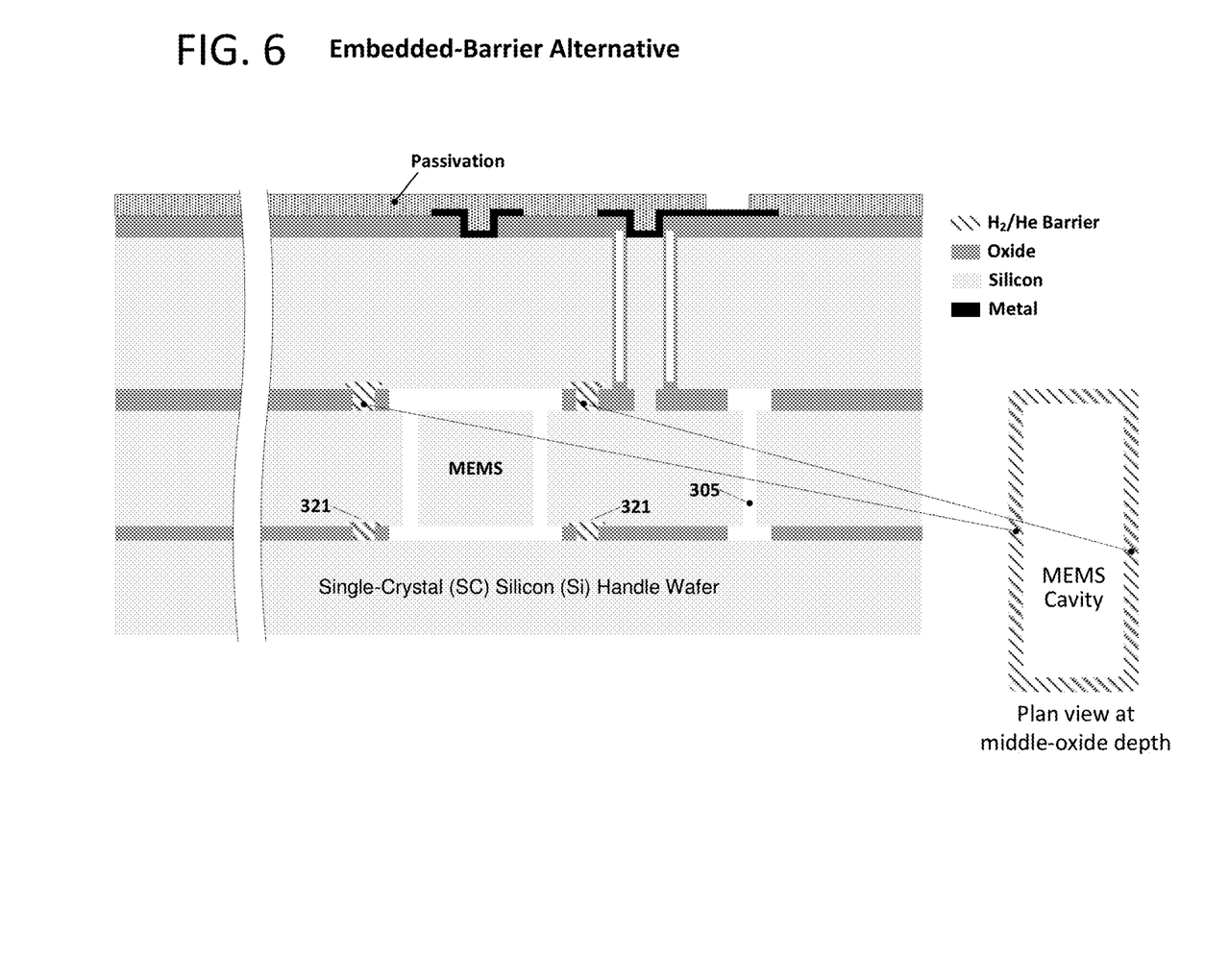
FIG. 6 illustrates an alternative strategic-barrier MEMS embodiment in which the buried oxide ring is centered in proximity to the MEMS cavity.

FIG. 5 illustrates a barricaded MEMS embodiment having hydrogen barrier structures strategically disposed in the middle and buried oxide layers, obviating surface-level barrier layer deposition. In the depicted implementation, hydrogen barrier rings 301 and 303 are formed in the middle oxide around the MEMS cavity and contact barrels, respectively (only one of the latter being shown), to block hydrogen propagation into the MEMS cavity through (i) the middle oxide layer itself and (ii) the electrode isolation trench 305 and buried oxide. An additional barrier ring 309 may be implemented in the buried oxide layer at the chip perimeter to block hydrogen incursion through the lateral chip exposure of that oxide layer. In the implementation shown, the middle-oxide contact-barrel barrier 303 shares a perimeter region with MEMS cavity barrier 301. In alternative embodiments, those two barriers may be non-overlapping (i.e., no shared perimeter region). Also, the buried-oxide barrier ring may alternatively be implemented by silicon as in FIGS. 1 and 2, or by a deep-trench barrier as shown at 279 in FIG. 4. FIG. 6 illustrates an alternative strategic-barrier MEMS embodiment having a buried oxide barrier-ring 321 routed in proximity to the MEMS cavity-inside the device-layer electrode-isolation trench 305 so that both the buried-oxide chip-surround barrier and the middle-oxide contact-surround barrier (i.e., elements 309 and 303 in FIG. 5) may be omitted.

Figure 7:
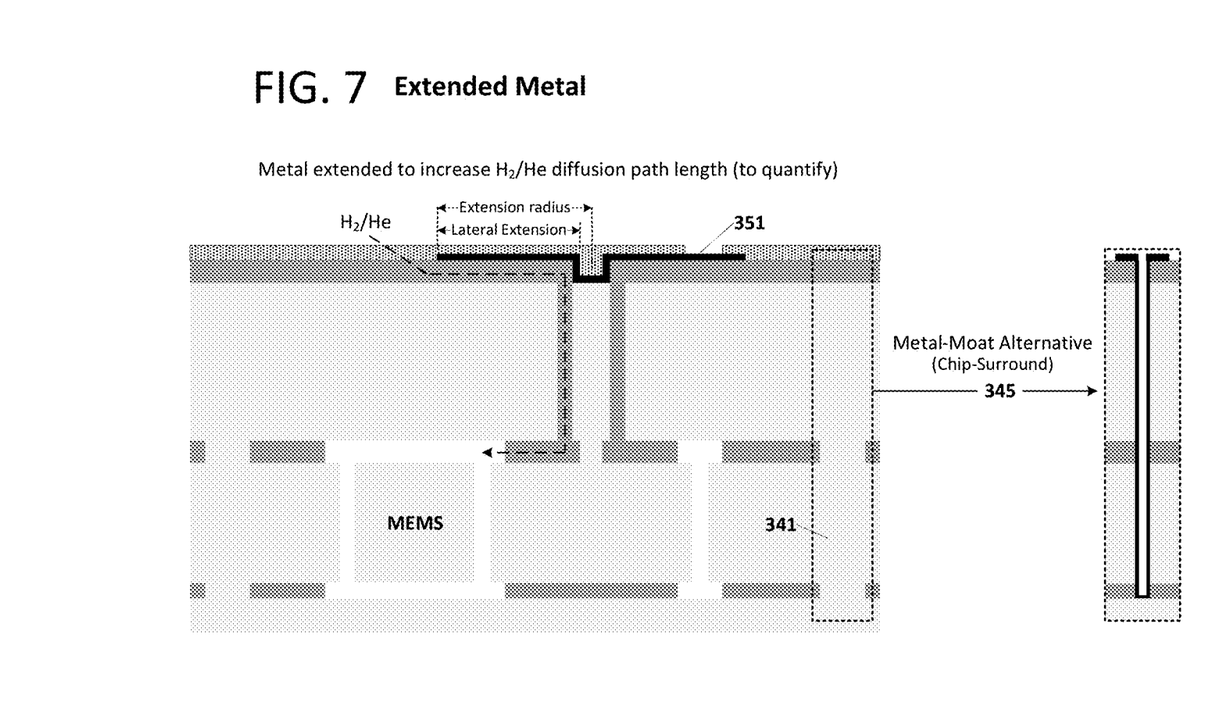
FIG. 7 illustrates hydrogen-resistant MEMS embodiment that lacks both the surface-level barrier layer shown in FIGS. 1-4 and the MEMS-cavity barrier ring shown in FIG. 5.

FIG. 7 illustrates hydrogen-resistant MEMS embodiment that lacks both the surface-level barrier layer shown in FIGS. 1-4 and the MEMS-cavity barrier ring shown in FIG. 5 (i.e., feature 301). As shown, a chip-surround hydrogen barrier 341 is formed in the middle and buried oxide layers (e.g., a hydrogen-blocking moat implemented by silicon or metal, with the latter shown at 345), while the hydrogen diffusion path through the surface-oxide is elongated-thus slowing the hydrogen incursion rate—by extending the radius or lateral dimension of metal contact 351. While this approach may not eliminate small-molecule incursion altogether, the increased diffusion path length may slow the incursion rate sufficiently to provide stable device operation in some environments or applications. In general, the lateral extension dimension (lateral extension beyond trench) of metal contact 351 may be selected according to any one or more of multiple criteria including, for example and without limitation, dimension to yield specified small-molecule incursion rate in given environment (e.g., incursion rate sufficiently limited to meet desired stability specification over intended device lifetime) or specific linear dimension (e.g., at least 5 microns and in some cases dimensions of 10 microns, 15 microns or more).

Figure 8:
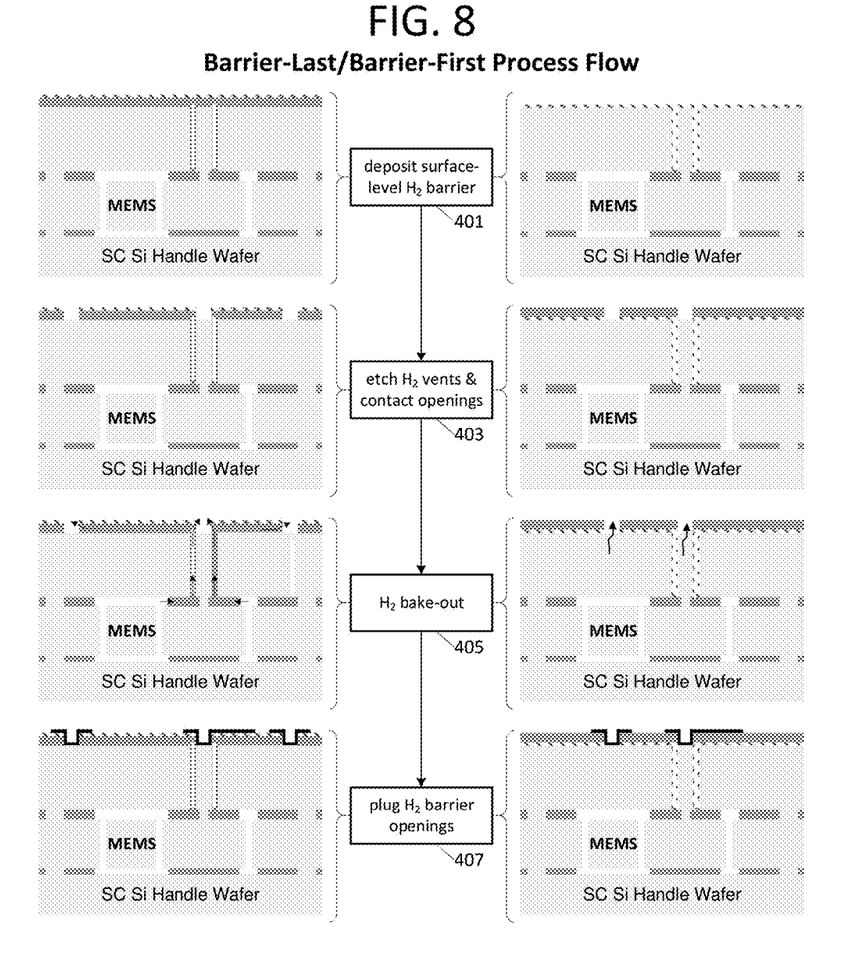
FIG. 8 illustrates an exemplary process flow that may be used to implement barrier structures within the barrier-last and barrier-first embodiments of FIGS. 1-4.

FIG. 8 illustrates an exemplary process flow that may be used to implement barrier structures within the barrier-last and barrier-first embodiments of FIGS. 1-4. Starting at 401 a hydrogen barrier layer (e.g., silicon nitride or other blocking material as discussed above) is deposited on the device surface (e.g., over lid-layer silicon in barrier-first implementation at right or over oxide in barrier-last implementation at left). At 403, vents and contact openings are etched through the surface oxide (a material deposition not specifically shown in the barrier-first process flow) and barrier layer, followed by a bake-out operation at 405 (e.g., elevating the temperature of the composite wafer structure to any practicable temperature between 100° C. and 1150° C., and in some embodiments between 300° C. and 600° C.) to expel residual hydrogen through the vents and contact openings. At 407, openings in the hydrogen barrier (vents and contact openings) are plugged with metal to seal the surface incursion/diffusion path. Note that hydrogen vent formation is an optional process step that may be omitted in some cases, particularly where contact openings are distributed and sized to provide sufficient venting.

Figure 9:
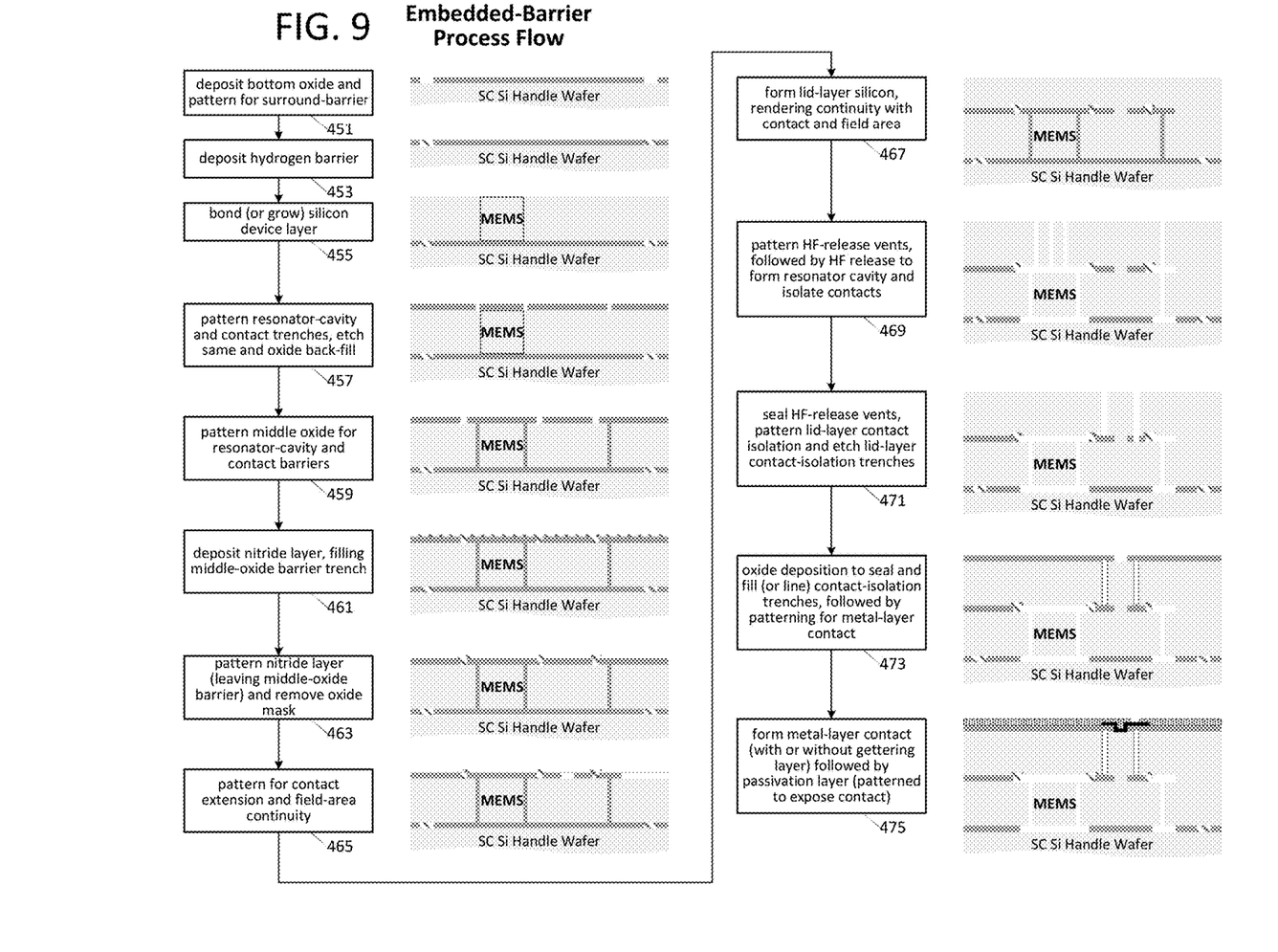
FIG. 9 illustrates an exemplary fabrication process for the embedded-barrier embodiment of FIG. 5.

FIG. 9 illustrates an exemplary fabrication process for the embedded-barrier embodiment of FIG. 5. Starting at 451, a bottom (to be buried) oxide layer is deposited over a silicon handle wafer and then patterned for subsequent chip-surround hydrogen-barrier deposition at 453. Device layer silicon is bonded (e.g., wafer-bonded) or grown at 455 and thereafter patterned (i.e., middle-oxide deposition followed by selective etch) at 457 in preparation for formation of trenches around resonator cavity (or cavity for other MEMS element) and contacts—an operation followed by trench-etch and oxide backfill. At 459, the middle oxide is patterned for hydrogen-barrier formation around the MEMS cavity and contact barrels, followed by barrier layer deposition at 461 (filling the patterned middle-oxide). At 463, the barrier layer is patterned (sacrificial oxide deposition and selective etch-back) and etched, leaving the barrier-surround structures. The resulting structure is patterned and etched for contact extension and field-area continuity at 465, followed by growth or wafer-bonding of lid-layer silicon at 467—in either case rendering continuity between the device-layer and lid-layer silicon through contact openings and field area. At 469, release vents are patterned and etched, followed by hydrofluoric acid (HF) release (i.e., dry vapor etch using a hydrofluoric solution or wet hydrofluoric acid) to remove sacrificial regions of the middle-oxide, buried oxide and trenches surrounding the MEMS element, thus forming the MEMS cavity and releasing the MEMS element from the surrounding field and/or contact regions of the device-layer silicon. At 471, the release vents are sealed (e.g., with epitaxial silicon) and the surface of the lid-layer silicon is patterned and then etched to form contact-isolation trenches (only one of which is shown). At 473, oxide is deposited to seal and fill (or line) contact-isolation trenches, followed by oxide patterning for metal-layer contact formation. At 475, metal layer contacts are formed (e.g., metal layer deposition followed by oxide deposition, masking and etch-back), followed by passivation deposition and selective etch-back to form contact opening.

Though not specifically in the exemplary fabrication processes of FIGS. 8 and 9, nor the various structural embodiments shown in FIGS. 1-7, lid-layer silicon may be wafer-bonded to the lower-layer structures (i.e., device-layer silicon and handle wafer) through structures that serve dual duty as wafer-bonds and electrical conductors (e.g., solder bonds, including eutectic bonds of various metals, metal alloys, silicides and so forth to interconnect electrical elements within the device-layer and lid-layer silicon). In such embodiments, the middle oxide layer may be completely or partially omitted (e.g., leaving a hydrogen-permeable channel in the form of a void between the lid-layer and device-layer silicon through which conductive bonding structures extend). Also, in all such embodiments, the lid-layer silicon wafer may have electrical circuitry (e.g., complementary metal oxide semiconductor (CMOS) circuitry) formed thereon prior to or after bonding to the MEMS device-layer silicon, and may be oriented in a flip-chip (circuit-side of lid wafer facing MEMS device-layer silicon) or upright (circuit-side of lid wafer facing away from MEMS device-layer silicon) configuration.

In all embodiments disclosed herein, device-layer silicon may be doped to yield conductive structures (e.g., electrodes, electrical continuity paths, etc.) and/or to effect mechanical resonance characteristics of MEMS resonator elements. In the FIG. 1-9 embodiments, for example, a MEMS resonator element or selected regions thereof may be degenerately doped (e.g., dopant concentration greater than $1E18/cm^{-3}$, and in some cases above $1E19/cm^{-3}$, or $1E20/cm^{-3}$) with n-type or p-type dopant of any practicable type (e.g., phosphorous, boron, antimony, etc.) to yield a desired temperature-coefficient of frequency (TCF)—particularly a substantially zero-sloped TCF (e.g., less than 50, 5, 1 or 0.5 parts per million) over a desired operating temperature range (e.g., a range of 100 degrees Celsius or more centered around room temperature).

At least the following embodiments are within the scope of the foregoing disclosure:

An apparatus for a hydrogen resistant sealed cavity on a silicon wafer comprising
  An enclosed cavity, at least part of the enclosure containing a hydrogen permeable material;
  A hydrogen blocking layer deposited onto the cavity enclosure An method for fabricating a device with a hydrogen resistant sealed cavity on a silicon wafer, the method comprising
  Forming an enclosed cavity, at least part of the enclosure containing a hydrogen permeable material;
  Outgassing the hydrogen inside the enclosure and surrounding material (outgassing may including subjecting the enclosed cavity to an elevated temperature)
  Depositing a hydrogen blocking layer onto the cavity enclosure An apparatus for a hydrogen resistant sealed cavity on a silicon wafer comprising
  A enclosed cavity, at least part of the enclosure containing a hydrogen permeable material;
  A first hydrogen blocking layer disposed on the cavity enclosure;
  Openings formed in the first hydrogen blocking layer so as to expose the hydrogen permeable material;
  A second hydrogen blocking layer deposited over the openings cut in the first hydrogen blocking layer, the second hydrogen blocking layer at least partially overlapping the first hydrogen blocking layer.

An method for fabricating a device with a hydrogen resistant sealed cavity on a silicon wafer, the method comprising
  Forming an enclosed cavity sealed at least partially with a hydrogen permeable material.
  Depositing a first hydrogen blocking layer onto the cavity enclosure
  Creating openings in the first hydrogen blocking layer so as to expose the hydrogen permeable material
  Outgassing the hydrogen trapped in the cavity and surrounding material by subjecting the device to an elevated temperature in a neutral environment
  Depositing and patterning a second hydrogen blocking layer over the openings in the first hydrogen blocking layer, such that the second hydrogen blocking layer at least partially overlaps the first hydrogen blocking layer In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific materials, dimensions (thicknesses), concentrations, operational order (e.g., order of device fabrication steps), temperatures and the like can be different from those described above in alternative embodiments. The term "coupled" is used herein to express a direct connection as well as a connection through one or more intervening functional components or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of forming a device having a microelectromechanical systems (MEMS) resonator, the method comprising:
   providing a substrate having a layer of crystal silicon material and a layer of dielectric material;
   providing a lid layer; and
   forming
      a cavity between the layer of crystal silicon material of a substrate and the lid layer,
      a body within the cavity, the body adapted to vibrate at a resonance frequency during operation of the MEMS resonator, and
      electrodes, the electrodes adapted to cause the body to vibrate and to sense the resonance frequency during operation of the MEMS resonator, and electrically coupling the electrodes with electrical contacts on an exterior surface of the device;
   wherein the method further comprises providing a hydrogen and helium barrier comprising one or more materials that are to block ingress of hydrogen or helium into the cavity, including at least one of a metal-based material, single-crystal silicon, or a nitride-based material; and
   wherein forming the cavity further comprises providing one or more vents between the cavity and an external environment and wherein providing the hydrogen and helium barrier further comprises depositing a material of the one or more materials so as to plug the one or more vents.

2. The method of claim 1 wherein:
   the one or more vents include at least one vent defined through the lid layer;
   forming the cavity comprises etching an oxide material from in between the substrate and the lid layer, via the one or more vents; and
   the method further comprises depositing a material of the one or more materials so as to plug the one or more vents, following the etching.

3. The method of claim 1 wherein:
   the method further comprises performing an outgassing process to expel at least one gas from an interior of the device through one or more vents defined in the lid; and
   the method further comprises depositing the material of the one or more materials, subsequent to performance of the outgassing process, so as to plug the one or more vents and thereby thereafter inhibit passage of the at least one gas between an exterior of the device and the cavity.

4. The method of claim 3 wherein the method further comprises depositing a gettering payer between the substrate and the lid layer, so as to absorb a residual gas following the depositing of the material which plugs the one or more vents.

5. The method of claim 1 wherein providing the hydrogen barrier comprises forming a cavity barrier ring to encircle the cavity and seal the cavity against lateral diffusion of hydrogen into the cavity, along a direction, parallel to a plane of the substrate and a direction parallel to a plane of the lid layer, from an environment external to the device.

6. The method of claim 1 wherein the lid comprises crystal silicon and one or more vents through the crystal silicon, wherein the method further comprises forming the cavity using an etch release process in which an oxide material is etched in situ by selective removal of the oxide material through the one or more vents, and wherein providing the hydrogen barrier comprises depositing at least one material, following performance of the etch release process, so as to block the one or more vents and so as to inhibit ingress of hydrogen into the cavity from an environment external to the device into the cavity, via the one or more vents.

7. The method of claim 1 wherein providing the lid layer comprises depositing one of monocrystalline silicon and polycrystalline silicon to lie above the dielectric layer, relative to the substrate, and wherein the layer of dielectric material comprises an oxide material.

8. A method of forming a device having a microelectromechanical systems (MEMS) resonator, the method comprising:
   providing a substrate having a layer of crystal silicon material and a layer of dielectric material;
   providing a lid layer; and
   forming
      a cavity between the layer of crystal silicon material of a substrate and the lid layer,
      a body within the cavity, the body adapted to vibrate at a resonance frequency during operation of the MEMS resonator, and
      electrodes, the electrodes adapted to cause the body to vibrate and to sense the resonance frequency during operation of the MEMS resonator, and electrically coupling the electrodes with electrical contacts on an exterior surface of the device;
   wherein the method further comprises providing a hydrogen barrier comprising one or more materials that are to block ingress of hydrogen into the cavity; and
   wherein providing the hydrogen barrier comprises depositing a material of the one or more materials as a first layer, forming one or more vents through the lid layer and the first layer, and, subsequent to performance of at least one of an outgassing process or an etch process in which material is evacuated through the one or more vents, depositing a material of the one or more materials so as to plug the one or more vents and the first layer and thereby inhibit subsequent passage of gas between an exterior of the device and the cavity through the one or more vents.

9. The method of claim 8 wherein the first layer comprises silicon nitride.

10. A method of forming a device having a microelectromechanical systems (MEMS) resonator, the method comprising:
providing a substrate having a layer of crystal silicon material and a layer of dielectric material;
providing a lid layer; and
forming
a cavity between the layer of crystal silicon material of a substrate and the lid layer,
a body within the cavity, the body adapted to vibrate at a resonance frequency during operation of the MEMS resonator, and
electrodes, the electrodes adapted to cause the body to vibrate and to sense the resonance frequency during operation of the MEMS resonator, and electrically coupling the electrodes with electrical contacts on an exterior surface of the device;
wherein the method further comprises providing a hydrogen barrier comprising one or more materials that are to block ingress of hydrogen into the cavity; and
wherein forming the body comprises forming the body so as to have a layer of a piezoelectric material and wherein forming the electrodes comprises forming at least a first one of the electrodes so as to, during operation of the MEMS resonator, supply impetus to the layer of the piezoelectric material, to cause the body to vibrate at a frequency, and forming at least a second one of the electrodes so as to, during operation of the MEMS resonator, sense the frequency of vibration.

11. A method of forming a device having a microelectromechanical systems (MEMS) resonator, the method comprising:
providing a substrate having a layer of crystal silicon material and a layer of dielectric material;
providing a lid layer;
depositing a surface oxide above the lid layer, such that the lid layer lies in between the surface oxide and the substrate;
forming electrical contacts on an exterior surface of the device; and
forming
a cavity between the layer of crystal silicon material of a substrate and the lid layer,
a body within the cavity, the body adapted to vibrate at a resonance frequency during operation of the MEMS resonator, and
electrodes, the electrodes adapted to cause the body to vibrate and to sense the resonance frequency during operation of the MEMS resonator, and electrically coupling the electrodes with the electrical contacts;
wherein electrically coupling comprises forming electrical paths between the electrodes and the electrical contacts, and depositing a contact isolation material so as to isolate the electrical paths from the lid layer; and
wherein the method further comprises providing a hydrogen barrier comprising one or more materials that are to block ingress of hydrogen into the cavity, the one or more materials including a material to isolate the electrical contacts from the surface oxide and thereby inhibit diffusion of hydrogen along an interface between the electrical paths and the contact isolation material.

12. The method of claim 11 wherein:
the dielectric material comprises an oxide material;
forming the cavity comprises etching the oxide material from in between the substrate and the lid layer, via one or more vents defined through the lid layer; and
the method further comprises depositing a material of the one or more materials so as to plug the one or more vents, following the etching.

13. The method of claim 11 wherein:
the method further comprises performing an outgassing process to expel at least one gas from an interior of the device through one or more vents defined in the lid; and
the method further comprises depositing a material of the one or more materials, subsequent to performance of the outgassing process, so as to plug the one or more vents and thereby thereafter inhibit passage of the at least one gas between an exterior of the device and the cavity.

14. The method of claim 13 wherein the method further comprises depositing a gettering payer between the substrate and the lid layer, so as to absorb a residual gas following the depositing of the material which plugs the one or more vents.

15. The method of claim 11 wherein the material to isolate the electrical contacts from the surface oxide and thereby inhibit diffusion of hydrogen along an interface between the electrical paths and the contact isolation material comprises silicon nitride.

16. The method of claim 11 wherein providing the hydrogen barrier comprises forming a cavity barrier ring to encircle the cavity and seal the cavity against lateral diffusion of hydrogen into the cavity, along a direction, parallel to a plane of the substrate and a direction parallel to a plane of the lid layer, from an environment external to the device.

17. The method of claim 11 wherein the lid comprises crystal silicon and one or more vents through the crystal silicon, wherein the method further comprises forming the cavity using an etch release process in which an oxide material is etched in situ by selective removal of the oxide material through the one or more vents, and wherein providing the hydrogen barrier comprises depositing at least one material, following performance of the etch release process, so as to block the one or more vents and so as to inhibit ingress of hydrogen into the cavity from an environment external to the device into the cavity, via the one or more vents.

18. The method of claim 11 wherein forming the body comprises forming the body so as to have a layer of a piezoelectric material and wherein forming the electrodes comprises forming at least a first one of the electrodes so as to, during operation of the MEMS resonator, supply impetus to the layer of the piezoelectric material, to cause the body to deflect, and forming at least a second one of the electrodes so as to, during operation of the MEMS resonator, sense a frequency of vibration of the body.

19. The method of claim 11 wherein providing the lid layer comprises depositing one of monocrystalline silicon and polycrystalline silicon to lie above the dielectric layer, relative to the substrate.

20. A method of forming a device having a microelectromechanical systems (MEMS) resonator, the method comprising:
providing a substrate having a layer of crystal silicon material and a layer of dielectric material;
providing a lid layer; and
forming
a cavity between the layer of crystal silicon material of a substrate and the lid layer, a body within the cavity, the body adapted to vibrate at a resonance frequency during operation of the MEMS resonator, and electrodes, the electrodes adapted to cause the body to vibrate and to sense the resonance frequency during operation of the MEMS resonator, and electrically coupling the electrodes with electrical contacts on an exterior surface of the device;

wherein the method further comprises providing a hydrogen barrier comprising one or more materials that are to block ingress of hydrogen into the cavity, including a cavity barrier ring to encircle the cavity and seal the cavity against lateral diffusion of hydrogen into the cavity, along a first direction, parallel to a plane of the substrate and a direction parallel to a plane of the lid layer, from an environment external to the device, and including a layer of material adapted to inhibit the passage of hydrogen into the cavity from a direction of the lid layer relative to the cavity.

\* \* \* \* \*

UNITED STATES PATENT AND TRADEMARK OFFICE
CERTIFICATE OF CORRECTION

PATENT NO. : 12,351,452 B1
APPLICATION NO. : 18/347139
DATED : July 8, 2025
INVENTOR(S) : Charles I. Grosjean et al.

Page 1 of 1

It is certified that error appears in the above-identified patent and that said Letters Patent is hereby corrected as shown below:

In the Claims

Column 10, Line 4, in Claim 3, please delete "lid;" and insert --lid layer;--

Column 10, Line 12, in Claim 4, please delete "payer" and insert --layer--

Column 10, Line 16, in Claim 5, please delete "hydrogen" and insert --hydrogen and helium--

Column 10, Line 22, in Claim 6, please delete "lid" and insert --lid layer--

Column 12, Line 20, in Claim 14, please delete "payer" and insert --layer--

Column 10, Line 35, in Claim 17, please delete "lid" and insert --lid layer--

Column 13, Line 17, in Claim 20, please delete "the"

Signed and Sealed this
Nineteenth Day of August, 2025

Coke Morgan Stewart
*Acting Director of the United States Patent and Trademark Office*